United States Patent
Momose et al.

(10) Patent No.: US 10,896,892 B2
(45) Date of Patent: Jan. 19, 2021

(54) WIRE BONDING APPARATUS

(71) Applicant: FUJI ELECTRIC CO., LTD., Kawasaki (JP)

(72) Inventors: Fumihiko Momose, Nagano (JP); Takashi Saito, Matsumoto (JP); Kazumasa Kido, Matsumoto (JP); Yoshitaka Nishimura, Azumino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 345 days.

(21) Appl. No.: 14/642,667

(22) Filed: Mar. 9, 2015

(65) Prior Publication Data

US 2015/0303166 A1 Oct. 22, 2015

(30) Foreign Application Priority Data

Apr. 17, 2014 (JP) .................. 2014-085666

(51) Int. Cl.
*B23K 20/00* (2006.01)
*H01L 23/00* (2006.01)
*B23K 20/10* (2006.01)

(52) U.S. Cl.
CPC ............. *H01L 24/78* (2013.01); *H01L 24/85* (2013.01); *B23K 20/004* (2013.01); *B23K 20/10* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/05599* (2013.01); *H01L 2224/29101* (2013.01); *H01L 2224/32225* (2013.01); *H01L 2224/45015* (2013.01); *H01L 2224/45124* (2013.01); *H01L 2224/45147* (2013.01); *H01L 2224/4847* (2013.01); *H01L 2224/48227* (2013.01);

(Continued)

(58) Field of Classification Search
CPC ........... H01L 2224/85205; H01L 2224/78313; B23K 20/004; B23K 20/005; B23K 20/10
See application file for complete search history.

(56) References Cited

U.S. PATENT DOCUMENTS 4,763,827 A * 8/1988 Watanabe ............ B23K 20/005
228/102
5,201,453 A * 4/1993 Amador ............... B23K 20/007
228/1.1

(Continued)

FOREIGN PATENT DOCUMENTS

CN 102208369 A 10/2011
JP 02194540 A * 8/1990 ............. H01L 24/78

(Continued)

*Primary Examiner* — Erin B Saad
(74) *Attorney, Agent, or Firm* — Rabin & Berdo, P.C.

(57) ABSTRACT

Provided is a wire bonding apparatus for electrically connecting an electrode and an aluminum alloy wire to each other by wire bonding. The apparatus includes a wire feeding device which feeds the wire. The wire has a diameter not less than 500 μm and not greater than 600 μm. The apparatus includes a heating device heats the wire to a temperature that is not lower than 50° C. and not higher than 100° C. The apparatus further includes a pressure device which presses the wire against the electrode. The apparatus further includes an ultrasonic wave generating device which generates an ultrasonic vibration that is applied to the wire that is pressed by the pressure device.

11 Claims, 5 Drawing Sheets

(52) U.S. Cl.
CPC ............ *H01L 2224/73265* (2013.01); *H01L 2224/789* (2013.01); *H01L 2224/78252* (2013.01); *H01L 2224/78313* (2013.01); *H01L 2224/78353* (2013.01); *H01L 2224/78611* (2013.01); *H01L 2224/859* (2013.01); *H01L 2224/85048* (2013.01); *H01L 2224/85099* (2013.01); *H01L 2224/85181* (2013.01); *H01L 2224/85201* (2013.01); *H01L 2224/85205* (2013.01); *H01L 2224/85207* (2013.01); *H01L 2224/85399* (2013.01); *H01L 2924/00014* (2013.01)

(56) References Cited

U.S. PATENT DOCUMENTS

| | | | | |
|---|---|---|---|---|
| 5,240,166 | A | * | 8/1993 | Fontana, Jr. ........... B23K 20/10 219/85.16 |
| 6,173,879 | B1 | * | 1/2001 | Chiba ................. B23K 20/007 228/1.1 |
| 2005/0284913 | A1 | * | 12/2005 | Lim ..................... B23K 20/005 228/4.5 |
| 2008/0093416 | A1 | * | 4/2008 | Utano .................. B23K 20/004 228/1.1 |
| 2008/0197168 | A1 | * | 8/2008 | Horino ................. B08B 7/0035 228/8 |
| 2009/0200357 | A1 | * | 8/2009 | Lee ..................... B23K 20/007 228/44.7 |
| 2011/0241224 | A1 | | 10/2011 | Tsubaki et al. |

FOREIGN PATENT DOCUMENTS

| | | |
|---|---|---|
| JP | H03-283542 A | 12/1991 |
| JP | H05-198930 A | 8/1993 |
| JP | H06104306 A | 4/1994 |
| JP | 2003-209213 A | 7/2003 |
| JP | 2003-303845 A | 10/2003 |
| JP | 2007-335708 A | 12/2007 |
| JP | 2013-171964 A | 9/2013 |

* cited by examiner

WIRE BONDING APPARATUS

CROSS-REFERENCE TO RELATED APPLICATIONS

This application is based on, and claims priority to, Japanese Patent Application No. 2014-085666, filed on Apr. 17, 2014, the contents of which are entirely incorporated herein by reference.

BACKGROUND OF THE INVENTION

1. Field of the Invention

The present invention relates to a semiconductor device manufacturing apparatus and a semiconductor device manufacturing method, which can wire-bond, to an electrode on a semiconductor element, a wire with a diameter not smaller than 500 μm and not larger than 600 μm.

2. Description of the Background Art

JP-A-3-283542, JP-A-5-198930 and JP-A-2003-209213 have been known as literatures about an apparatus in which wire bonding is performed with ultrasonic treatment, pressure treatment and heat treatment during the wire bonding.

JP-A-3-283542 has described a method for connecting a semiconductor chip, in which solder bumps containing one of Pb, In and Sn as a main component are adhesively bonded on an electrode pad which is made of an aluminum alloy and which is formed on a semiconductor chip, and the solder bumps are bonded onto a wiring of a substrate by thermocompression bonding in a state in which the solder bumps are heated to a temperature not higher than the liquids temperature of the solder bumps. JP-A-3-283542 has also described that the thermocompression bonding method is to perform thermocompression bonding using an ultrasonic wave in combination.

JP-A-5-198930 has described a bonding apparatus configured as follows. That is, the bonding apparatus includes a bonding chip which is used for applying ultrasonic vibration to a wire and heating the wire to a predetermined temperature so that the wire can be diffusion-bonded to a pad disposed on a printed circuit board. The bonding chip is moved up/down vertically. A depression is formed in a front end of the bonding chip so that the depression can hold the wire. When the bonding chip presses the wire through the depression, the bonding chip can be rotated in a predetermined direction with the center of the bonding chip as the axis of rotation if occasion demands.

JP-A-2003-209213 has described, in Paragraphs [0021] and [0022], a semiconductor device manufacturing method in which a semiconductor chip on which stud bumps are formed is bonded to 0.35 mm-wide copper leads by ultrasonic bonding. JP-A-2003-209213 has described that the ultrasonic bonding is performed under conditions that a heating temperature is 100° C., pressure is 0.5N and ultrasonic power is 70 mW.

In addition, JP-A-2003-303845 has described that an ultrasonic wire bonder applies ultrasonic vibration generated by an ultrasonic vibration unit to a bonding tool through an ultrasonic horn. JP-A-2003-303845 has also described that the ultrasonic wire bonder further includes a wire feeding unit, a preheating unit and a heating heater. JP-A-2003-303845 has further described that an aluminum wire is heated to about 250° C. to 400° C. by the preheating unit to therefore form a thin portion of the wire.

JP-A-3-283542 has a problem that a step of placing solder on the electrode pad is required because the solder is used for bonding the wire and the electrode pad on the semiconductor chip. In addition, JP-A-3-283542 has another problem that energy requiring for heating is large because the temperature during the thermocompression bonding is 170° C.

Although describing that the bonding chip is heated at a predetermined temperature, JP-A-5-198930 has not described any specific value about the heating temperature.

JP-A-2003-209213 has described, in Paragraphs [0021] and [0022], that the width of the copper lead is 0.35 mm. The method according to JP-A-2003-209213 is different from that according to the present invention as to the raw material or the lead width. There is a problem that a wire at which the present invention is aimed, that is, a wire whose diameter is not smaller than 500 μm and not larger than 600 μm cannot be bonded in the method according to JP-A-2003-209213.

According to JP-A-2003-303845, the thin portion heated and formed by pressure molding is not a bonded portion of the wire bonded to the electrode but a loop portion of the wire, but the temperature of the portion to which ultrasonic vibration according to the invention is applied has not been described. Accordingly, JP-A-2003-303845 has not described that the temperature of the bonded portion of the wire during the wire bonding is not lower than 50° C. and not higher than 100° C. as in the invention.

JP-A-2013-171964 has disclosed an ultrasonic wire bonding apparatus in which a wire with a diameter larger than 50 μm and not larger than 2 mm is bonded both to a first electrode on a semiconductor element and to a second electrode disposed outside the semiconductor element by wedge bonding to thereby electrically connect the two electrodes to each other. The ultrasonic wire bonding apparatus has a bonding tool which engages its front end with the wire, a wire feeding mechanism which feeds the wire to the bonding tool, a vibration transmission mechanism which applies ultrasonic vibration to the bonding tool, and a pressure mechanism which applies a load to the bonding tool and presses a bonded portion of the wire bonded to the electrodes. The ultrasonic wire bonding apparatus further has a heating mechanism which heats the bonded portion of the wire. JP-A-2013-171964 is aimed at a copper wire and the range of heating temperature is also wide. On the other hand, the present invention is aimed at an aluminum alloy wire. Since the aluminum alloy wire has its unique problem, JP-A-2013-171964 cannot solve the problem solved by the invention.

SUMMARY OF THE INVENTION

As a result of diligent researches conducted in order to solve the foregoing problems, it has been found that an unbonded region is generated inside a bonded region of a wire with a thick diameter if heating temperature is too high when the wire is bonded by an ultrasonic wave with heating and pressure. Therefore, an object of the invention is to provide a semiconductor device manufacturing apparatus and a semiconductor device manufacturing method, which can wire-bond, to an electrode on a semiconductor element, a wire with a diameter not smaller than 500 μm and not larger than 600 μm.

In order to solve the problems, a wire bonding apparatus according to an embodiment of the invention is a wire bonding apparatus for electrically connecting an electrode and an aluminum alloy wire to each other by wire bonding, the apparatus including: a wire feeding device which feeds the wire with a diameter not smaller than 500 μm and not larger than 600 μm; a heating device which heats the wire to a temperature not lower than 50° C. and not higher than 100°

C.; a pressure device which presses the wire against the electrode; and an ultrasonic wave generating device which applies ultrasonic vibration to the wire pressed by the pressure device. According to this configuration, the wire during the wire bonding is heated to a temperature not lower than 50° C. and not higher than 100° C. Accordingly, it is possible to increase a bonded area between the wire and the electrode and it is possible to wire-bond, to the electrode, the wire with the diameter not smaller than 500 µm and not larger than 600 µm. When the temperature of the wire is lower than 50° C., there is a problem that the bonded area may be insufficient. When the temperature of the wire exceeds 100° C., there is a problem that an unbonded area between the wire and the electrode may increase.

In the aforementioned wire bonding apparatus, preferably, the heating device includes: one or both of a wire heater which heats the wire and a flat plate heater which heats the wire through the electrode; a temperature sensor which measures the temperature of the wire; and a control device which compares the temperature measured by the temperature sensor with a set temperature and controls an output of the heating device; and the pressure device includes: a horn which transmits ultrasonic vibration generated by the ultrasonic wave generating device; and a bonding chip which is fixed to an end portion of the horn removably.

According to the configuration, the wire temperature can be automatically controlled by the temperature sensor of the heating device to be not lower than 50° C. and not higher than 100° C. In the case of heating the wire, the heated range is limited so that consumption energy required for the heating can be reduced, in comparison with the case where the whole of the wire bonding apparatus performing wire bonding is temperature-controlled. In the case of heating the wire through the electrode, a heat transfer area between the heating device and the electrode can be increased easily so that the structure of the wire bonding apparatus can be simplified.

In addition, a wire bonding method according to an embodiment of the invention is a wire bonding method for electrically connecting an electrode and an aluminum alloy wire to each other by wire bonding with heat treatment, pressure treatment and ultrasonic treatment, the method including: a heating step of heating the wire to a temperature not lower than 50° C. and not higher than 100° C.; a pressure step of placing the wire with a diameter not smaller than 500 µm and not larger than 600 von the electrode and pressing the wire against the electrode; and an ultrasonic treatment step of applying ultrasonic vibration to the wire during the pressure step performed on the wire whose temperature is not lower than 50° C. and not higher than 100° C.

According to the configuration, the wire during the wire bonding is heated to the temperature not lower than 50° C. and not higher than 100° C. Accordingly, a bonded area between the wire and the electrode can be increased so that the wire with the diameter not smaller than 500 µm and not larger than 600 µm can be wire-bonded to the electrode on the semiconductor element. When the temperature of the wire is lower than 50° C., there is a problem that the bonded area may be insufficient. When the temperature of the wire exceeds 100° C., there is a problem that an unbonded area between the wire and the electrode may increase.

According to the invention, it is possible to provide a wire bonding apparatus and a wire bonding method, which can wire-bond, to an electrode, a wire with a diameter not smaller than 500 µm and not larger than 600 µm.

DETAILED DESCRIPTION OF THE INVENTION

A wire bonding apparatus according to an embodiment of the invention will be described below with reference to the drawings. The same constituent members are referred to by the same numerals correspondingly and duplicate description thereof will be omitted. Incidentally, the invention is not limited to the following embodiments but can be modified suitably and carried out without changing the scope and spirit of the invention.

Embodiments

Figure 1:
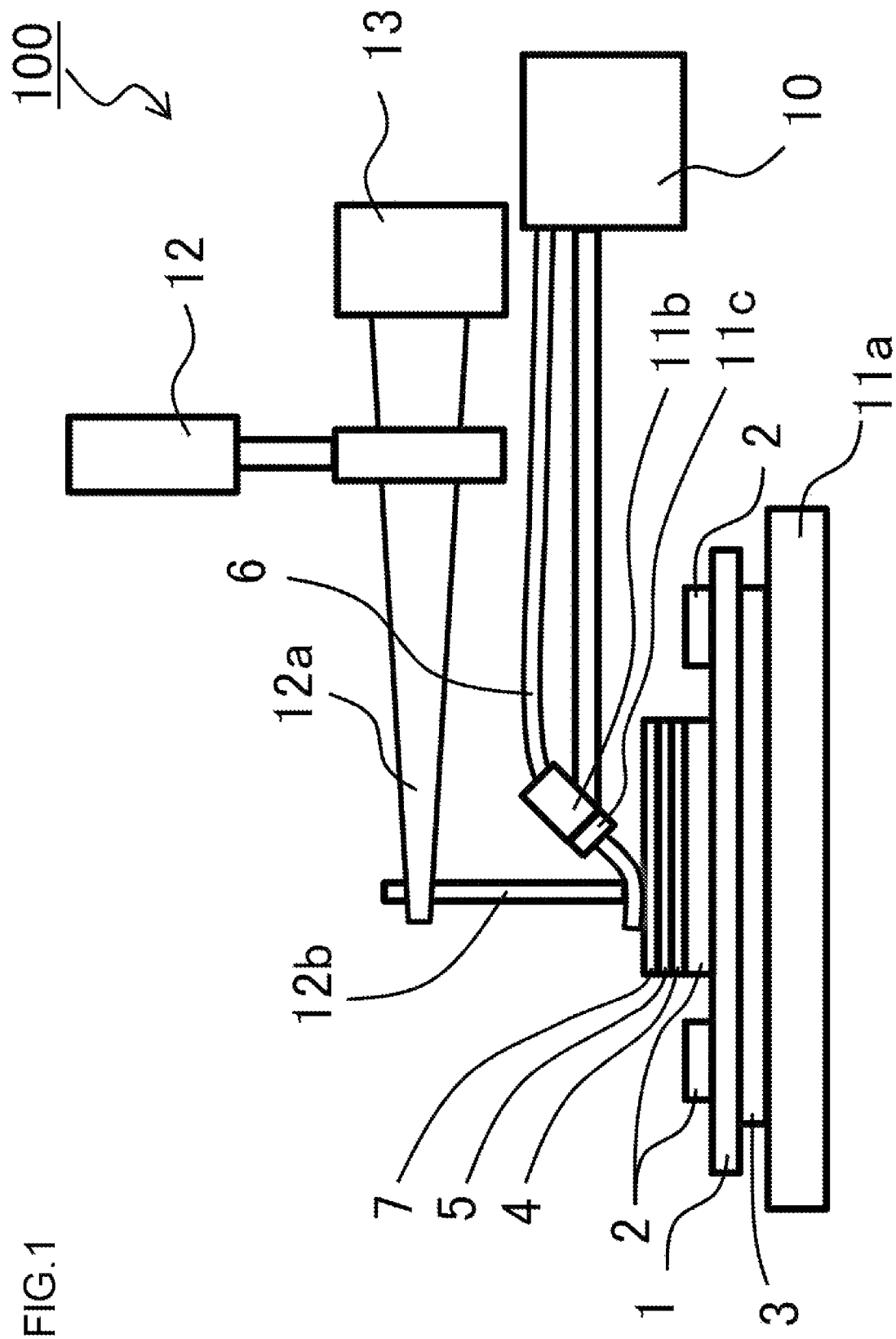
FIG. 1 is a schematic view of the configuration of a wire bonding apparatus according to an embodiment of the invention.

FIG. 1 is a schematic view of the configuration of a wire bonding apparatus according to an embodiment of the invention. FIG. 1 illustrates a case in which a wire bonding apparatus 100 processes a workpiece which is a structure including an insulating substrate 1, a first electrode 2 formed on a front surface of the insulating substrate 1, a rear metal plate 3 formed on a rear surface of the insulating substrate 1, a semiconductor element 5 connected onto the first electrode 2 through solder 4, and a second electrode 7 formed on an upper surface of the semiconductor element 5.

The wire bonding apparatus 100 in FIG. 1 includes a wire feeding device 10 which feeds a wire 6 with a diameter not smaller than 500 µm and not larger than 600 µm, a heating device 11 which heats the wire 6 to a temperature not lower than 50° C. and not higher than 100° C., a pressure device 12 which presses the wire 6 against the electrode 2 or 7, and an ultrasonic wave generating device 13 which applies ultrasonic vibration to the wire 6 pressed by the pressure device 12.

The wire feeding device 10 is internally provided with the wire 6 wound on a reel. The wire 6 is put between not-shown rollers. The rollers are rotated by a rotator so that the wire 6 can be fed to a wire heater 11b.

The heating device 11 is provided with the wire heater 11b which heats the wire 6, and a flat plate heater 11a which heats the wire 6 through the electrode 2 or 7. Incidentally, the heating device may be configured to include only one of the wire heater 11b and the flat plate heater 11a. The wire heater 11b is provided with a through hole through which the wire 6 can be passed. The wire 6 is passed through the through hole. A heater is built in an inner wall of the through hole. The flat plate heater 11a heats a rear surface of the rear metal plate 3 directly. When the wire 6 is connected to the first electrode 2, the flat plate heater 11a heats the wire 6 through the rear metal plate 3, the insulating substrate 1 and the first electrode 2. When the wire 6 is connected to the second electrode 7, the flat plate heater 11a heats the wire 6 through the rear metal plate 3, the insulating substrate 1, the first electrode 2, the solder 4, the semiconductor element 5, and the second electrode 7.

Figure 2:
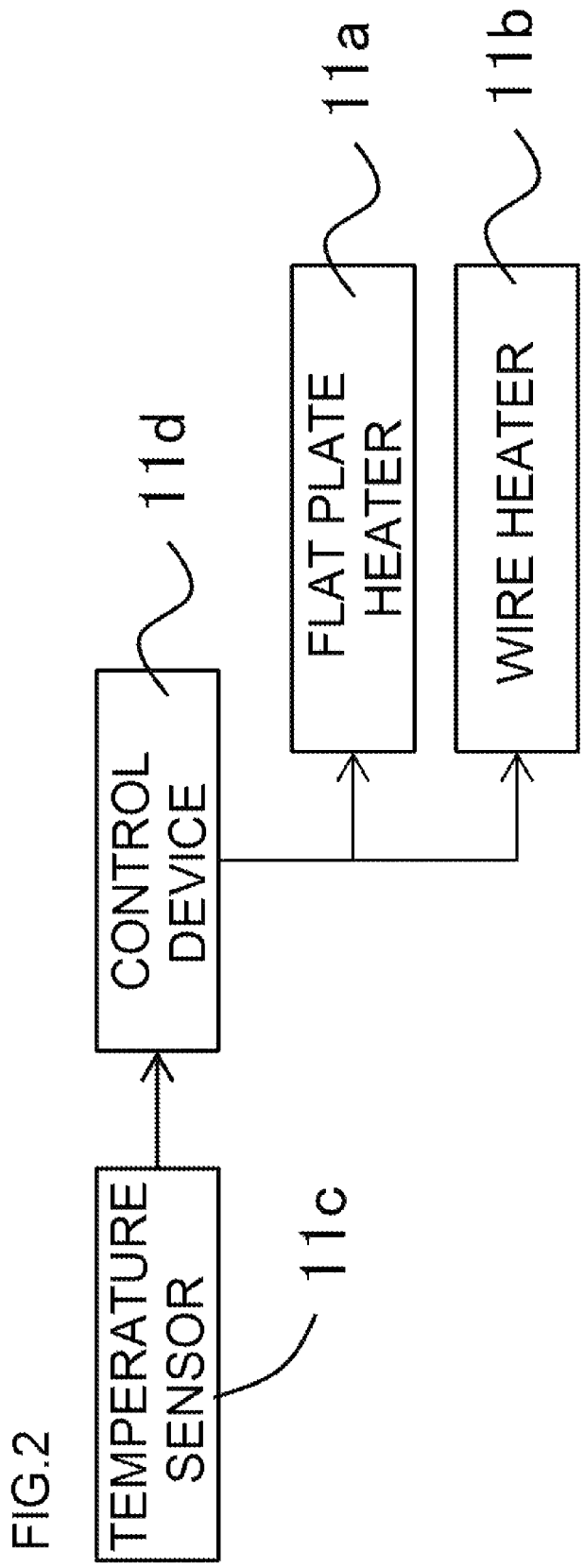
FIG. 2 is a relevant diagram about temperature control of a heating device of the wire bonding apparatus according to the embodiment of the invention.

FIG. 2 is a relevant diagram about temperature control of the heating device of the wire bonding apparatus according to the embodiment of the invention. As shown in FIG. 2, the wire bonding apparatus 100 further includes a temperature sensor 11c which measures the temperature of the wire 6 to determine a measured temperature, and a control device 11d which compares the temperature measured by the temperature sensor 11c (i.e., the measured temperature) with a set temperature to forma comparison result and controls the output of the heating device 11 based upon the comparison result. In detail, the control device 11d controls the output of the heating device 11 to control the temperature of the wire 6 based upon a comparison result based upon comparing the temperature measured by the temperature sensor 11c with the set temperature. So if the temperature measured by the temperature sensor 11c is greater than the set temperature, the output of the heating device 11 may be reduced to reduce heating of the wire 6. If the temperature measured by the temperature sensor 11c is less than the set temperature, the output of the heating device 11 may be increased to heat the wire 6. If the temperature measured by the temperature sensor 11c is equal than the set temperature, the output of the heating device 11 may be maintained. Although not shown in FIG. 1 and FIG. 2, the wire bonding apparatus 100 includes an input device through which the set temperature is inputted.

As shown in FIG. 1, the pressure device 12 is provided with a horn 12a which transmits ultrasonic vibration generated by the ultrasonic wave generating device 13, and a bonding chip 12b (which may also be referred to as a pressure application device) which is fixed to an end portion of the horn 12a removably. A depression is formed in a front end of the bonding chip 12b. The wire 6 is disposed in the depression. The bonding chip 12b presses the wire 6 from above and transmits ultrasonic vibration to the wire 6 via the horn from the ultrasonic wave generating device. The pressure device 12 is configured to include a mechanism pressing a part of the horn 12a so that the pressure device 12 can adjust a load with which the bonding chip 12b presses the wire 6 from above. Although the pressing mechanism is not limited particularly, for example, the pressing mechanism may be configured so that a member making contact with the horn 12a is urged by a spring to push down the horn 12a. The load with which the bonding chip 12b presses the wire 6 from above can be adjusted by adjustment of the length of the spring.

Figure 3:
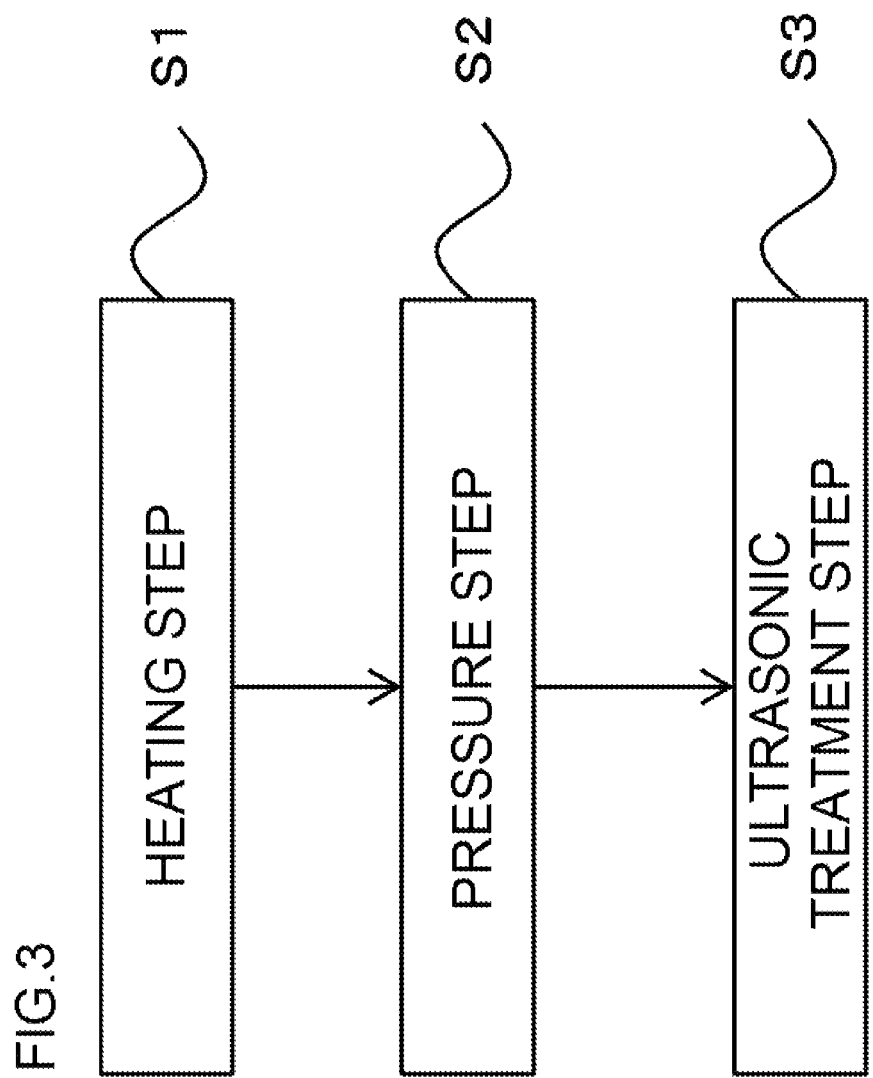
FIG. 3 is a view of steps of a wire bonding method according to an embodiment of the invention.

Next, a wire bonding method according to the invention will be described. FIG. 3 is a view of steps of the wire bonding method according to an embodiment of the invention. The wire bonding method according to the invention includes a heating step S1 of heating a wire to a temperature not lower than 50° C. and not higher than 100° C., a pressure step S2 of placing the wire with a diameter not smaller than 500 μm and not larger than 600 μm on the electrode and pressing the wire against the electrode, and an ultrasonic treatment step S3 of applying ultrasonic vibration to the wire during the pressure step performed on the wire whose temperature is not lower than 50° C. and not higher than 100° C.

Figure 4:
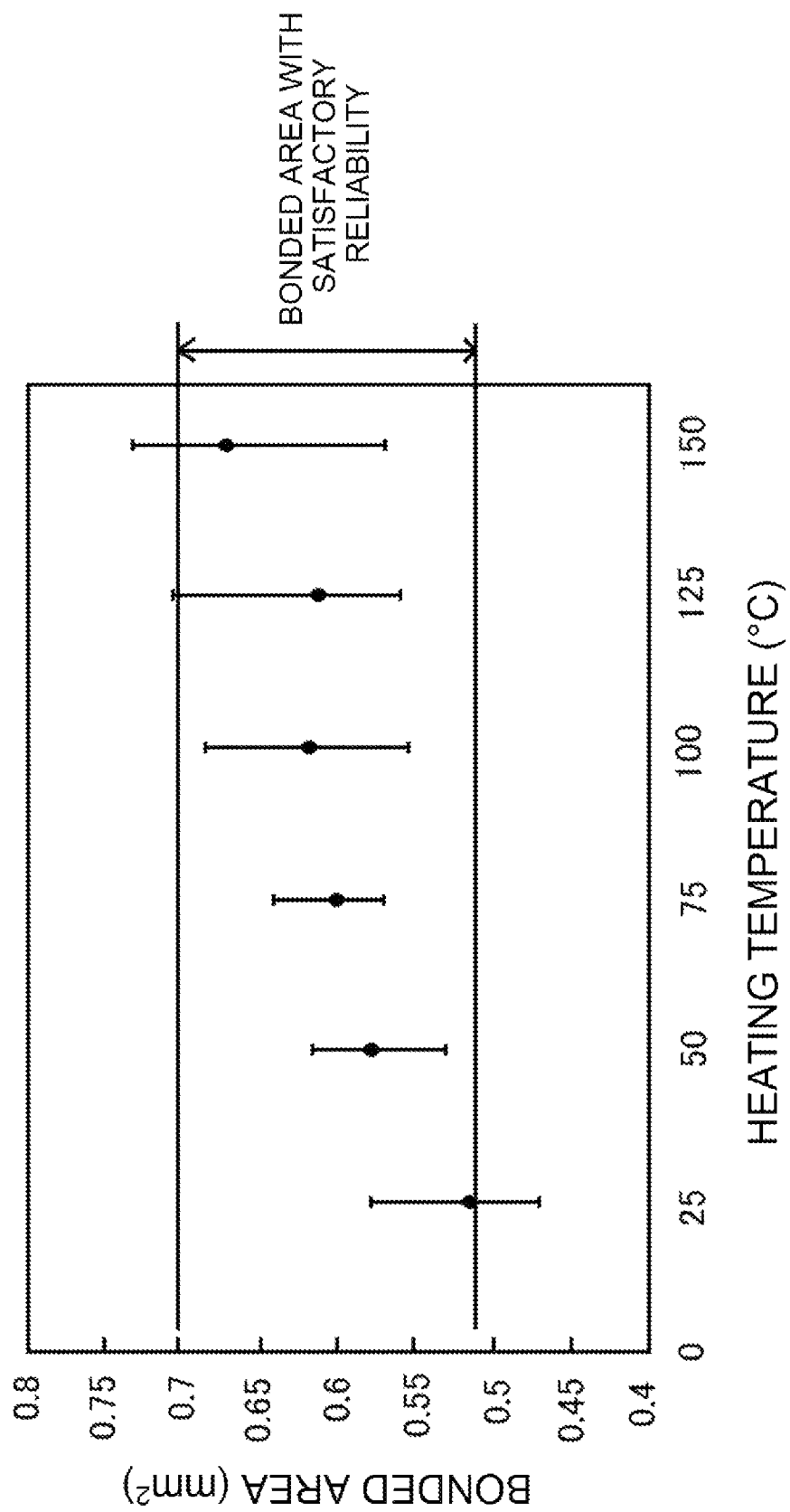
FIG. 4 is a graph showing the relation between heating temperature in a heating step and a bonded area between a wire and an electrode.
Figure 5:
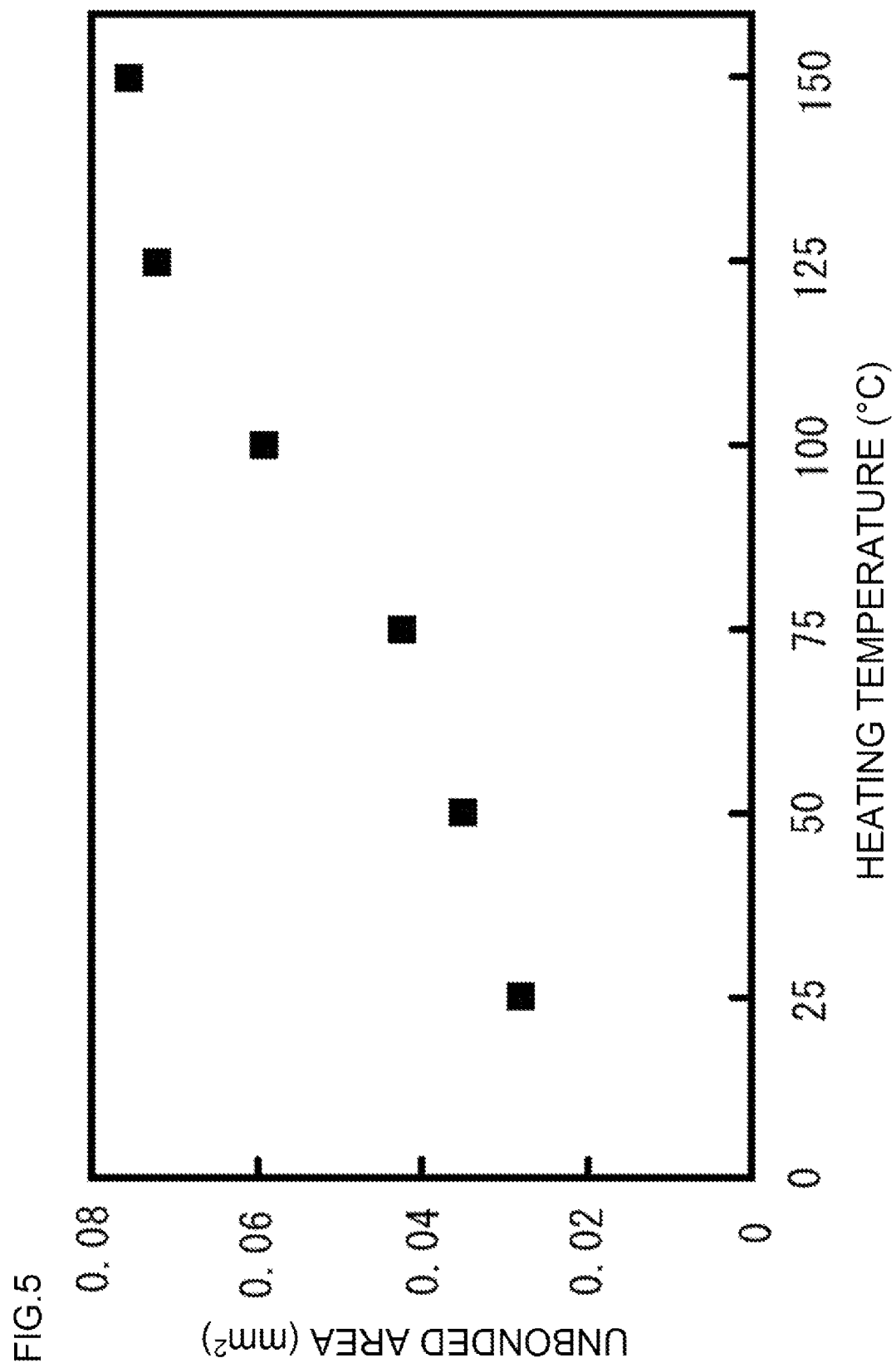
FIG. 5 is a graph showing the relation between heating temperature in the heating step and an unbonded area inside the bonded portion between the wire and the electrode.

FIG. 4 and FIG. 5 show experimental results of ultrasonic bonding at respective heating temperatures. An aluminum wire with a diameter of 500 μm was bonded on an electrode of a 5 μm-thick film. The experiments were conducted under ultrasonic power of 130 mW, a load of 1,400 gf and an ultrasonic wave application time of 200 ms. Each of the experiments was conducted 10 times and the maximum value and the minimum value are indicated on an error bar.

FIG. 4 is a graph showing the relation between the heating temperature in the heating step and a bonded area between the wire and the electrode. It is proved that the bonded area increases with the increase of the heating temperature.

FIG. 5 is a graph showing the relation between the heating temperature in the heating step and an unbonded area inside the bonded portion between the wire and the electrode. It is proved that the unbonded area inside the bonded portion of the wire increases with the increase of the heating temperature.

When the aforementioned results are taken into consideration, the bonded area may be not sufficient if the wire temperature in the heating step S1 is lower than 50° C. Therefore, there is a problem that bonding strength of the wire bonding may be not sufficient. On the other hand, there is a problem that the unbonded area inside the bonded portion of the wire may increase if the wire temperature exceeds 100° C.

It is more preferable that the wire temperature in the heating step S1 is within the range of from 50° C. to 75° C. (both inclusive). When the wire temperature exceeds 75° C., the bonding strength of the wire bonding varies easily due to heat treatment. Further, there is a problem that the cost becomes more expensive because heating energy required for the wire bonding increases.

As described above, according to the embodiments of the invention, it is possible to provide a wire bonding apparatus and a wire bonding method, which can wire-bond, to an electrode, a wire with a diameter not smaller than 500 μm and not larger than 600 μm.

What is claimed is:

1. A wire bonding apparatus for electrically connecting an electrode and an aluminum alloy wire, which has a diameter not less than 500 μm and not greater than 600 μm, to each other by wire bonding, the apparatus comprising:
   a wire feeding device which includes a reel on which the aluminum alloy wire having the diameter not less than 500 μm is wound, and feeds the wire from the reel;
   a first wire heater having a through-hole formed therein, the first wire heater having a heater built in an inner wall of the through-hole, a diameter of the through-hole being not less than 500 μm, so as to allow the wire to pass therethrough, the first wire heater heating the wire, as the wire passes through the through-hole of the first wire heater, to a temperature of 50° C. to 100° C., the first wire heater including a temperature sensor measuring the temperature of the wire, provided at an end of the first wire heater and adjacent to where the wire is to bond to the electrode;
   a control device controlling an output of the first wire heater to control the temperature of the wire;
   a pressure device which presses the heated wire that passes through the first wire heater, against the electrode; and
   an ultrasonic wave generating device which generates an ultrasonic vibration and applies the ultrasonic vibration to the heated wire that is pressed by the pressure device.

2. The wire bonding apparatus according to claim 1, wherein the pressure device includes a horn which transmits the ultrasonic vibration generated by the ultrasonic wave generating device to the wire.

3. The wire bonding apparatus according to claim 2, wherein the pressure device includes a bonding chip which is removably fixed to an end portion of the horn.

4. The wire bonding apparatus according to claim 1, further comprising a second wire heater including a flat plate heater which maintains the temperature of the wire at 50° C. to 100° C., while the pressure device presses the heated wire on the flat plate heater.

5. The wire bonding apparatus according to claim 1, further comprising a second wire heater including a flat plate heater separate from the first wire heater, the flat plate heater maintaining the temperature of the wire at 50° C. to 100° C., while the pressure device presses the heated wire on the flat heater.

6. The wire bonding apparatus according to claim 1, wherein the pressure device includes a horn which transmits the ultrasonic vibration generated by the ultrasonic wave generating device to the wire.

7. The wire bonding apparatus according to claim 6, wherein the pressure device includes a bonding chip which is removably fixed to an end portion of the horn.

8. A wire bonding method for electrically connecting an electrode and an aluminum alloy wire to each other by wire bonding with heat treatment, pressure treatment and ultrasonic treatment via a wire bonding apparatus, the wire bonding apparatus including
a wire feeding device which includes a reel on which the aluminum alloy wire is wound, and which feeds the wire from the reel,
a first wire heater having a through-hole formed therein, the first wire heater having a heater built in an inner wall of the through-hole, a diameter of the through-hole being not less than 500 μm, so as to allow the wire to pass therethrough, the first wire heater heating the wire, as the wire passes through the through-hole of the first wire heater, to a temperature of 50° C. to 100° C., the first wire heater including a temperature sensor measuring the temperature of the wire, provided at an end of the first wire heater and adjacent to where the wire is to bond to the electrode,
a control device controlling an output of the first wire heater to control the temperature of the wire,
a pressure device which presses the heated wire that passes through the first wire heater, against the electrode, and
an ultrasonic wave generating device which generates an ultrasonic vibration and
applies the ultrasonic vibration to the heated wire that is pressed by the pressure device, the method comprising:
heating the wire by the first wire heater to a temperature not lower than 50° C. and not higher than 100° C.;
disposing the wire by placing the wire on the electrode and pressing the wire against the electrode by the pressure device; and
applying an ultrasonic vibration to the wire concurrently with the disposing the wire by the ultrasonic wave generating device, while the temperature of the wire is not lower than 50° C. and not higher than 100° C.,
wherein the wire has a diameter not less than 500 μm and not greater than 600 μm.

9. The wire bonding apparatus according to claim 1, wherein the pressure device includes a pressure application device and a mechanism for adjusting a load with which the pressure application device presses the wire.

10. The wire bonding apparatus according to claim 1, wherein the control device controls the temperature of the wire to be in a range of 50° C. to 75° C.

11. The wire bonding apparatus according to claim 1, wherein
the pressure device includes
a horn which transmits ultrasonic vibration generated by the ultrasonic wave generating device, and
a bonding chip which is removably fixed to an end of the horn, and presses the wire on the electrode and transmits the ultrasonic vibration through the horn to the wire at the same time.

* * * * *